United States Patent
Claydon et al.

(10) Patent No.: US 7,327,022 B2
(45) Date of Patent: Feb. 5, 2008

(54) ASSEMBLY, CONTACT AND COUPLING INTERCONNECTION FOR OPTOELECTRONICS

(75) Inventors: Glenn Scott Claydon, Wynantskill, NY (US); Matthew Christian Nielsen, Schenectady, NY (US); Samhita Dasgupta, Niskayuna, NY (US); Robert John Filkins, Niskayuna, NY (US); Glenn Alan Forman, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 447 days.

(21) Appl. No.: 10/248,237

(22) Filed: Dec. 30, 2002

(65) Prior Publication Data

US 2004/0126050 A1    Jul. 1, 2004

(51) Int. Cl.
*H01L 23/48* (2006.01)
*H01L 23/52* (2006.01)
*H01L 29/40* (2006.01)
*H01L 23/29* (2006.01)
*H01L 23/02* (2006.01)

(52) U.S. Cl. .................. 257/689; 257/67; 257/621; 257/661; 257/665; 257/685; 257/686; 257/688; 257/700; 257/774; 257/643; 257/723; 257/724; 257/725; 257/759; 257/760; 257/792

(58) Field of Classification Search .............. 257/67, 257/621, 661, 665, 685–686, 688–689, 700, 257/774, 643, 723–725, 759–760, 792
See application file for complete search history.

(56) References Cited

U.S. PATENT DOCUMENTS

| | | | | |
|---|---|---|---|---|
| 4,783,695 A | * | 11/1988 | Eichelberger et al. | 257/668 |
| 5,138,469 A | * | 8/1992 | Wood et al. | 359/3 |
| 5,214,525 A | | 5/1993 | Gershman et al. | |
| 5,324,687 A | * | 6/1994 | Wojnarowski | 438/107 |
| 5,363,275 A | * | 11/1994 | Frankeny et al. | 361/749 |
| 5,436,471 A | * | 7/1995 | Hoko | 257/31 |

(Continued)

FOREIGN PATENT DOCUMENTS

DE    19622459 C1    11/1997

(Continued)

OTHER PUBLICATIONS

"Deformable mirrors flex low-cost potential", OLE May 2001, pp. 37-39 Evan Thrush, Ofer Levi, Ke Wang, Mark A. Wistey, James S. Harris, Jr., Stephen J. Smith: Solid State and Photonics laboratory, Stanford University, Dept. of Molecular and Cellular Physiology, Stanford University; "Integrated semiconductor fluorescent detection system for biochip and biomedical applications".

(Continued)

*Primary Examiner*—Ida M. Soward
(74) *Attorney, Agent, or Firm*—Shawn A. McClintic; William E. Powell, III

(57) ABSTRACT

A novel micro optical system as a platform technology for electrical and optical interconnections, thermal and mechanical assembly and integration of electronic, optoelectronic, passive and active components. This platform provides optical coupling and chip-to-chip interconnection by microwave electrical, optical guided and unguided waves, and power or bias electrical contacts or interfaces by a novel chip in flexible circuit, rigid or inflexible embodiments.

28 Claims, 15 Drawing Sheets

U.S. PATENT DOCUMENTS

| | | | |
|---|---|---|---|
| 5,452,182 A * | 9/1995 | Eichelberger et al. | 361/749 |
| 5,518,817 A | 5/1996 | Yamasaki et al. | |
| 5,696,862 A | 12/1997 | Hauer et al. | |
| 5,776,797 A * | 7/1998 | Nicewarner, Jr. et al. | 438/107 |
| 5,898,183 A * | 4/1999 | Teder | 250/574 |
| 5,925,897 A * | 7/1999 | Oberman | 257/80 |
| 5,995,370 A * | 11/1999 | Nakamori | 361/704 |
| 6,027,958 A * | 2/2000 | Vu et al. | 438/110 |
| 6,084,294 A * | 7/2000 | Tomita | 257/686 |
| 6,134,013 A | 10/2000 | Sirat et al. | |
| 6,300,679 B1 * | 10/2001 | Mukerji et al. | 257/738 |
| 6,316,281 B1 | 11/2001 | Lee et al. | |
| 6,396,712 B1 * | 5/2002 | Kuijk | 361/767 |
| 6,445,475 B1 | 9/2002 | Okubora et al. | |
| 6,486,544 B1 * | 11/2002 | Hashimoto | 257/686 |
| 6,521,483 B1 * | 2/2003 | Hashimoto | 438/110 |
| 6,563,223 B2 * | 5/2003 | Freeman | 257/778 |
| 6,590,282 B1 * | 7/2003 | Wang et al. | 257/686 |
| 6,600,222 B1 * | 7/2003 | Levardo | 257/686 |
| 6,657,620 B2 * | 12/2003 | Oishi et al. | 345/204 |
| 6,682,199 B2 * | 1/2004 | Kaneko | 359/846 |
| 6,683,377 B1 * | 1/2004 | Shim et al. | 257/723 |
| 6,699,730 B2 * | 3/2004 | Kim et al. | 438/107 |
| 6,706,546 B2 * | 3/2004 | Yoshimura et al. | 438/31 |
| 6,765,288 B2 * | 7/2004 | Damberg | 257/698 |
| 6,815,259 B2 * | 11/2004 | Ninomiya et al. | 438/125 |
| 6,872,983 B2 * | 3/2005 | Liu | 257/80 |
| 6,905,908 B2 * | 6/2005 | Zhang et al. | 438/99 |
| 7,006,294 B2 * | 2/2006 | Steenblik et al. | 359/619 |
| 7,075,112 B2 * | 7/2006 | Roberts et al. | 257/79 |
| 7,115,983 B2 * | 10/2006 | Wagner | 257/686 |
| 2001/0008306 A1 * | 7/2001 | Kamei et al. | 257/723 |
| 2001/0041025 A1 | 11/2001 | Farahi | |
| 2002/0097962 A1 * | 7/2002 | Yoshimura et al. | 385/50 |
| 2002/0102060 A1 | 8/2002 | Jewell et al. | |
| 2002/0117669 A1 * | 8/2002 | Aruga | 257/59 |
| 2003/0168725 A1 * | 9/2003 | Warner et al. | 257/686 |
| 2004/0135160 A1 * | 7/2004 | Cok | 257/88 |
| 2005/0040510 A1 * | 2/2005 | Hashimoto | 257/686 |

FOREIGN PATENT DOCUMENTS

| | | |
|---|---|---|
| EP | 1037511 A2 | 9/2000 |
| EP | 0710861 B1 | 2/2003 |
| EP | 1174745 B1 | 5/2006 |
| JP | 2001013377 A | 1/2001 |
| WO | WO02055974 A1 | 7/2002 |

OTHER PUBLICATIONS

D.L. Geddis and N.M. Jorkerst, School of Electrical and Computer Engineering, Georgia Institute of Technology, Atlanta, GA; ≠A Bi-directional Optical Link Using a Stacked Thin Film Emitter and Detector: CLEO 2002/Tuesday Morning; pp. 138-139.

PCT International Search Report dated May 11, 2004.

* cited by examiner

US 7,327,022 B2

ASSEMBLY, CONTACT AND COUPLING INTERCONNECTION FOR OPTOELECTRONICS

BACKGROUND OF THE INVENTION

This invention relates to integrated optics and, more specifically to an integrated micro optical bench for supporting an optoelectronic assembly.

Schemes incorporating a high number of discrete and integrated optical and electronic components are required to create optical systems in applications such as server backplanes, medical optical sensor arrays and general communications systems. These systems create electrical and optical signals that require a high number of components and an even higher number of interconnections required for generating and controlling the signals and signal integrity desired in such products.

Traditional optical and electronic assembly use physical isolation in individual packages that add significant cost, materials, size and weight to the systems they serve. These isolated packages include hermetic metal and ceramic enclosures that prevent interaction with the environment or one another. Connectors and interconnections between components add to reliability concerns. Separate heat sinks allow thermal isolation but create long physical paths that cause crosstalk and EMI. Optical interconnections require alignment and lens to account for more physical distance and additional amplification is required to account for losses due to physical distance and connectors. Complex hybrids created on silicon called silicon optical benches (SOB) attempt to solve this problem but are very limited in material type, matching characteristics, thickness and dielectric compatability to microwave and optical requirements. Typically, such SOBs are used to pigtail rather than integrate many thousands of connections.

Thus, there is a continuing need in the prior art to achieve high signal quality in both electrical and optical interconnections in optoelectronic devices without power penalties by integrating their unique characteristics onto an integrated micro optical bench.

BRIEF DESCRIPTION OF THE INVENTION

An embodiment of the invention is a micro optical system comprising a rigid substrate and a thermal substrate positioned in a spaced relation from the rigid substrate. An optoelectronic integrated circuit is positioned on the rigid substrate. An electronic driver is positioned on the thermal substrate for driving the optoelectronic integrated circuit. A flexible dielectric substrate is positioned so as to overlay and imbed therein the electronic driver, the optoelectronic integrated circuit, the thermal substrate and the rigid substrate.

DETAILED DESCRIPTION OF THE INVENTION

Figure 1:
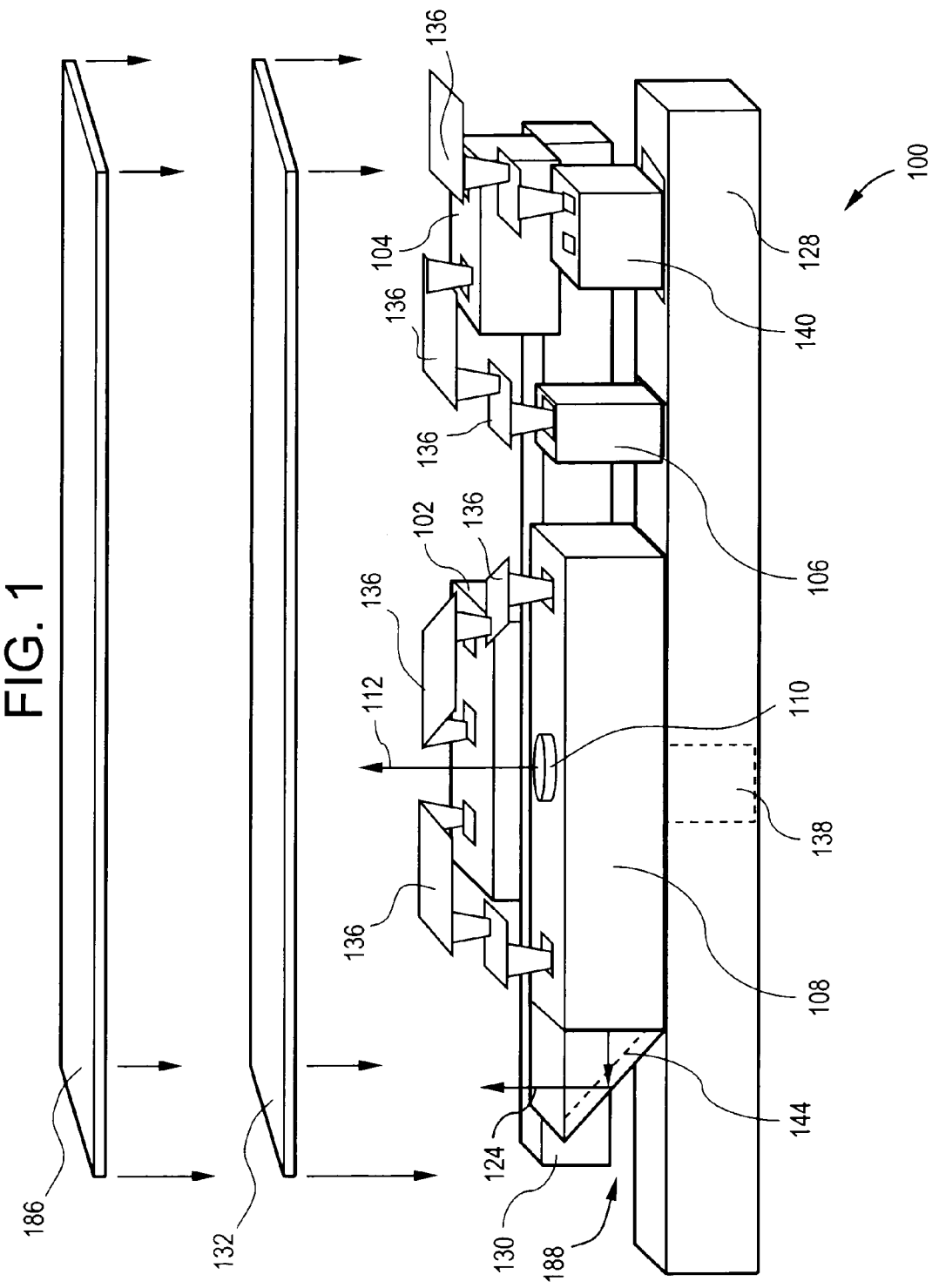
FIG. 1 is a three dimensional view of an integrated micro optical bench for supporting an optoelectronic circuit.
Figure 2:
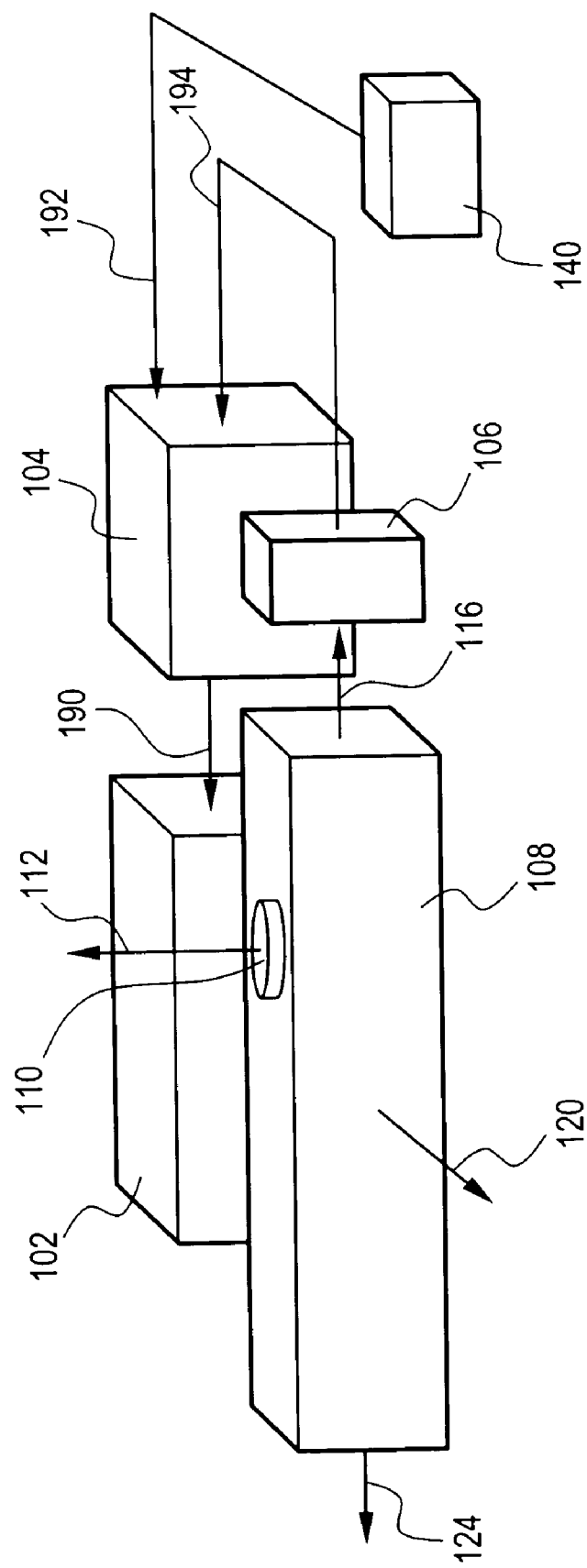
FIG. 2 is a three dimensional view of individual elements of the integrated micro optical bench of FIG. 1 as a transmitter.
Figure 3:
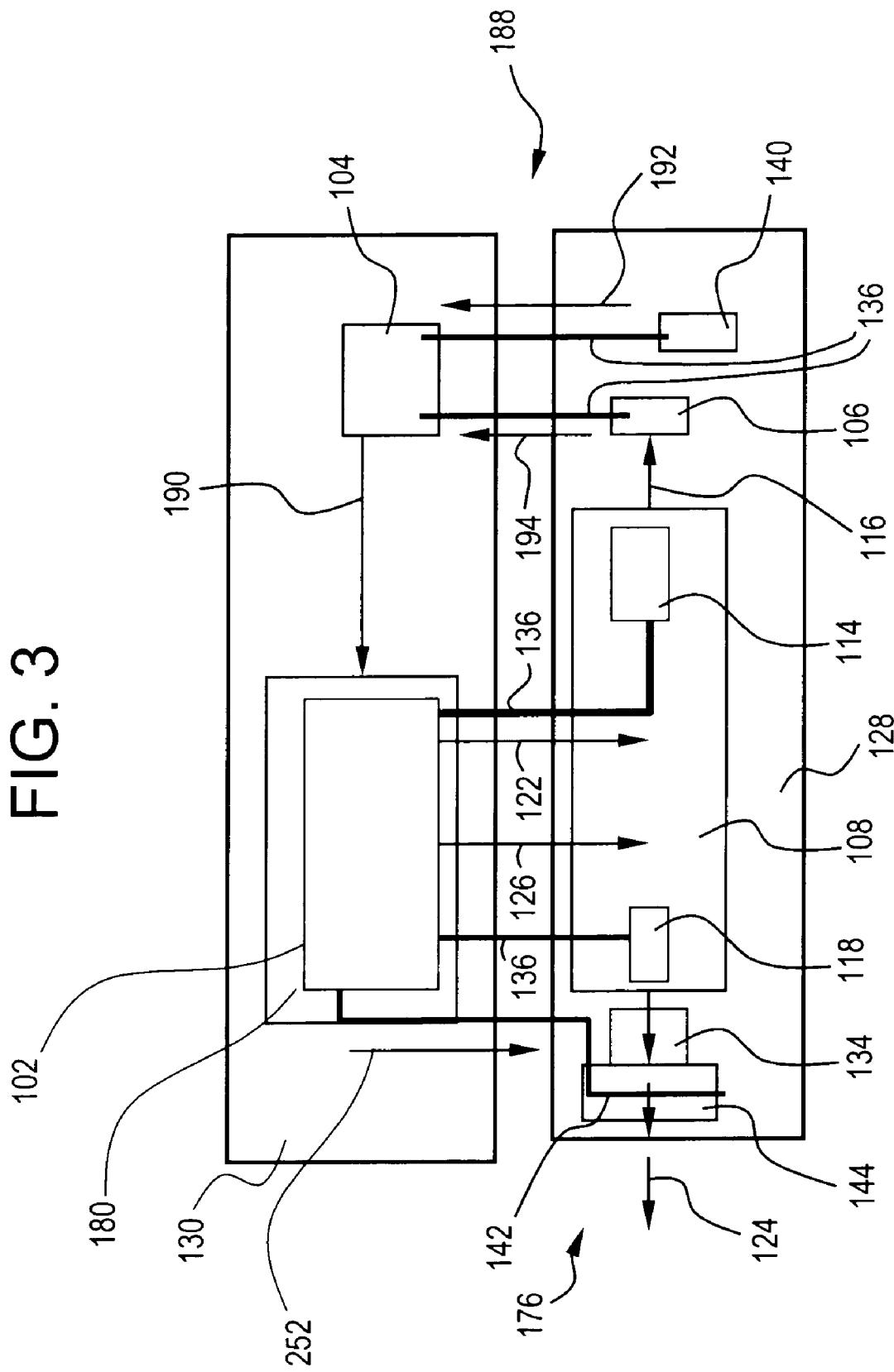
FIG. 3 is a top view of the integrated micro optical bench of FIG. 1.

Referring to FIGS. 1, 2 and 3 a micro optical system as an integrated micro optical bench for supporting an optoelectronic assembly or circuit is shown generally at 100. The integrated micro optical bench 100 comprises a rigid substrate 128 comprising for example an alumina ceramic or silicon substrate. A thermal substrate 130 is positioned in a spaced relation from the rigid substrate 128. The rigid and thermal substrates 128, 130 are spaced apart at 188 by approximately 25 microns. The space designated by the reference numeral 188 may be left as a void space or may be filled with a flexible, thermally nonconducting filler material. An optoelectronic integrated circuit (OEIC) 108 is positioned on the rigid substrate 128 and may comprise for example a continuous wave or pulsed laser 114 providing an output optical signal 124. The continuous wave (CW) or pulsed laser 114 includes for example a distributed feedback (DFB) laser, a Fabry-Perot (FP) laser, a surface emitting laser such as a vertical cavity surface emitting (VCSEL) laser, an edge emitting laser or other suitable laser diode. It is contemplated that such laser includes front, rear, side, top and angled facet emission therefrom. The OEIC 108 may also include an electroabsorptive modulator (EAM) 118 for modulating the output optical signal 124 of the laser 114. A power monitoring unit 106 (e.g. PIN photodiode, avalanche photodiode—APD) is positioned on the rigid substrate 128. The power monitoring unit 106 is in signal communication at 116 with the optoelectronic integrated circuit 108 by measuring the power of a segment of the output optical signal 116 radiated from the rear facet of the laser 114 thus, monitoring the output performance of the optoelectronic circuit 108. A thermistor 140 is positioned on the rigid substrate 128 for monitoring the temperature thereof.

As seen in FIG. 3, the optoelectronic integrated circuit (OEIC) 108 provides as out put a pulsed or continuous wave optical signal 124 which may be directed to a waveguide such as an optical fiber 184 (FIG. 5) or other optical devices. Also in FIG. 3, it is seen that an electronic driver 102 provides as output three drive signals, 122, 126, 252. Drive signal 122 is a DC bias signal for causing the laser 114 to generate a continuous wave optical output signal 124. Alternatively drive signal 122 (injection current) can be a direct modulation signal causing the OEIC 108 to modulate between a light emitting diode (LED) state and a laser diode (LD) state. Drive signal 126 is a electrical signal to drive the electroabsorptive modulator (EAM) 118. Drive signal 252 is an RF modulating signal to modulate an optical signal in an electro-optic modulator (described below).

Continuing in FIGS. 1, 2 and 3, a microchip 180, including the electronic driver 102, such as a monolithic integrated circuit (MMIC) is positioned on the thermal substrate 130. The electronic driver 102 provides drive signals 122, 126, 252 to the optoelectronic circuit 108. A control unit 104, positioned on the thermal substrate 130 and in signal communication at 194 with the power monitoring unit 106 and at 192 with the thermistor 140, thereby controls the electronic driver 102. As seen in FIG. 1, a plurality of patterned metallization layers, or traces 136 electrically interconnect the electronic driver 102 and the optoelectronic integrated circuit 108. The patterned metallization layers 136 also electrically interconnect the power monitoring unit 106 and the thermistor 140 and the control unit 104 and other elements of the micro optical system 100. Still further, as seen in FIG. 1 (and FIGS. 4, 5, 6 7), a first flexible polymer substrate 132 is positioned so as to overlay and imbed therein the assembly of the electronic driver 102, the controller 104, the power monitoring unit 106, the optoelectronic integrated circuit 108, the thermistor 140, the rigid and thermal substrates 128, 130 and the metallization layers 136 from above, or to underlay (e.g., to undergird) said assembly from below. Also as seen in FIG. 1 (and FIGS. 4, 5, 6, 7), a second flexible polymer substrate 186 may be provided.

Examples of suitable organic materials in the flexible polymer substrates 132, 186 and the electro-optic modulator 146, 148 include poly(acrylates); poly(alkyl methacrylates), for example poly(methyl methacrylate) (PMMA); poly (tetrafluoroethylene) (PTFE); silicones; and mixtures comprising at least one of the foregoing organic materials, wherein the alkyl groups have from one to about twelve carbon atoms. The flexible polymer substrates 132, 186 may also comprise for example a polymer such as a polyimide polymer such as KAPTON®. Coupled with the fact that the rigid substrate 128 and the thermal substrate 130 are separate components displaced from one another, or joined by the flexible, thermally nonconducting filler material, and the flexible nature of dielectric polymer substrates 132, 186, the integrated micro optical bench 100 is capable of complete flexure between the rigid and thermal substrates 128, 130 and the components positioned thereon. This is seen in FIG. 4.

As best understood from the description of the integrated micro optical bench 100, the rigid substrate 128 provides a rigid platform for the precise alignment of optical components in the optoelectronic integrated circuit 108. The thermal substrate 130 provides a platform in the nature of a heat exchanger by and through which heat, generated by the control unit 104 and the electronic driver 102, may be dissipated from the integrated micro optical bench 100. To that end, thermal isolation between high heat energy generated by the electronic driver 102 and the stable optoelectronics is provided by the boundary 188 between the two physically adjacent substrates 128, 130. The electronic driver 102 and the OEIC 108 have separate thermal paths enabled by conduction such as by micropipes that change the direction of these opposite thermal paths.

Figure 4:
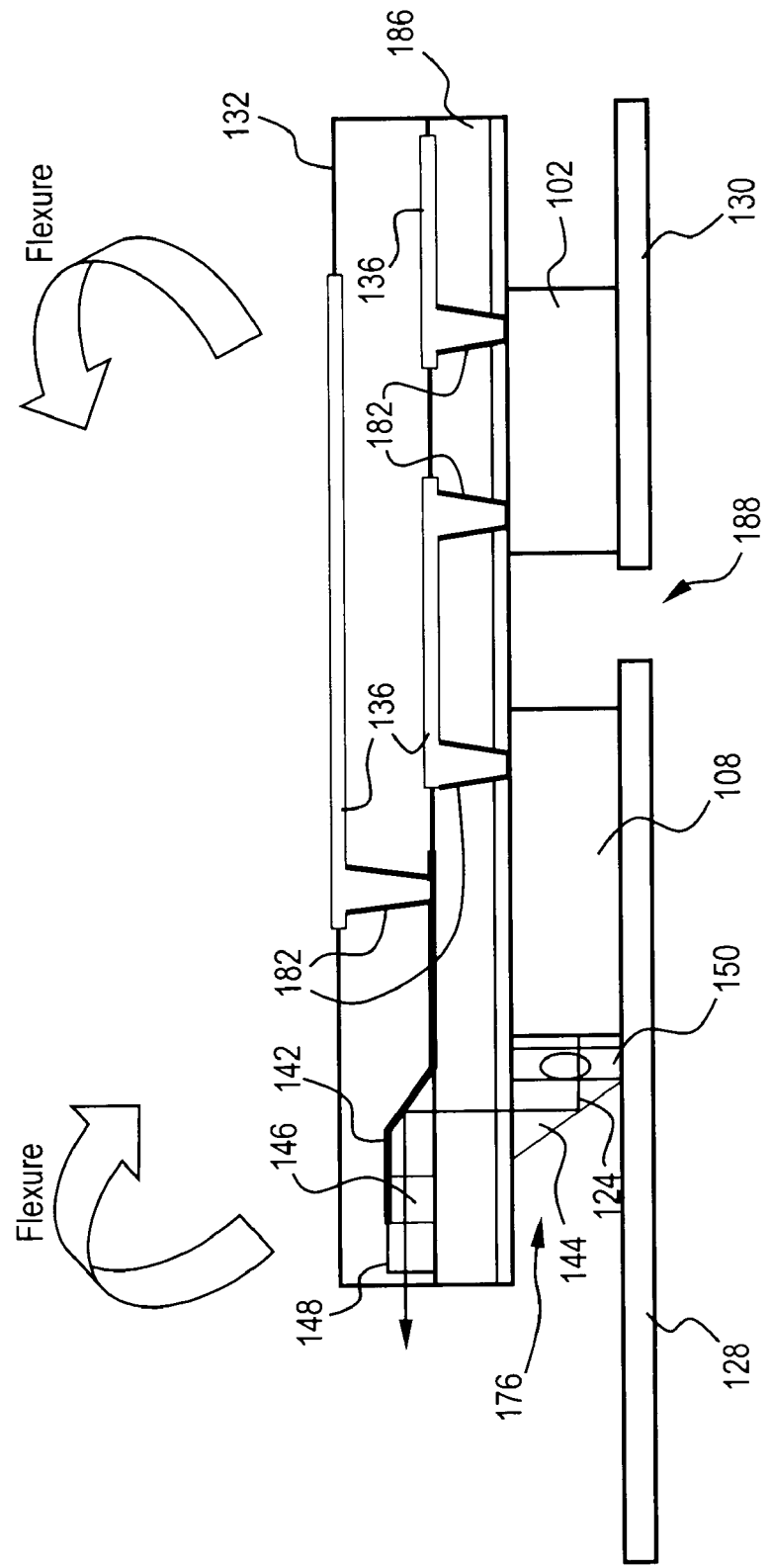
FIG. 4 is a sectional view of the integrated micro optical bench of FIG. 1.
Figure 16:
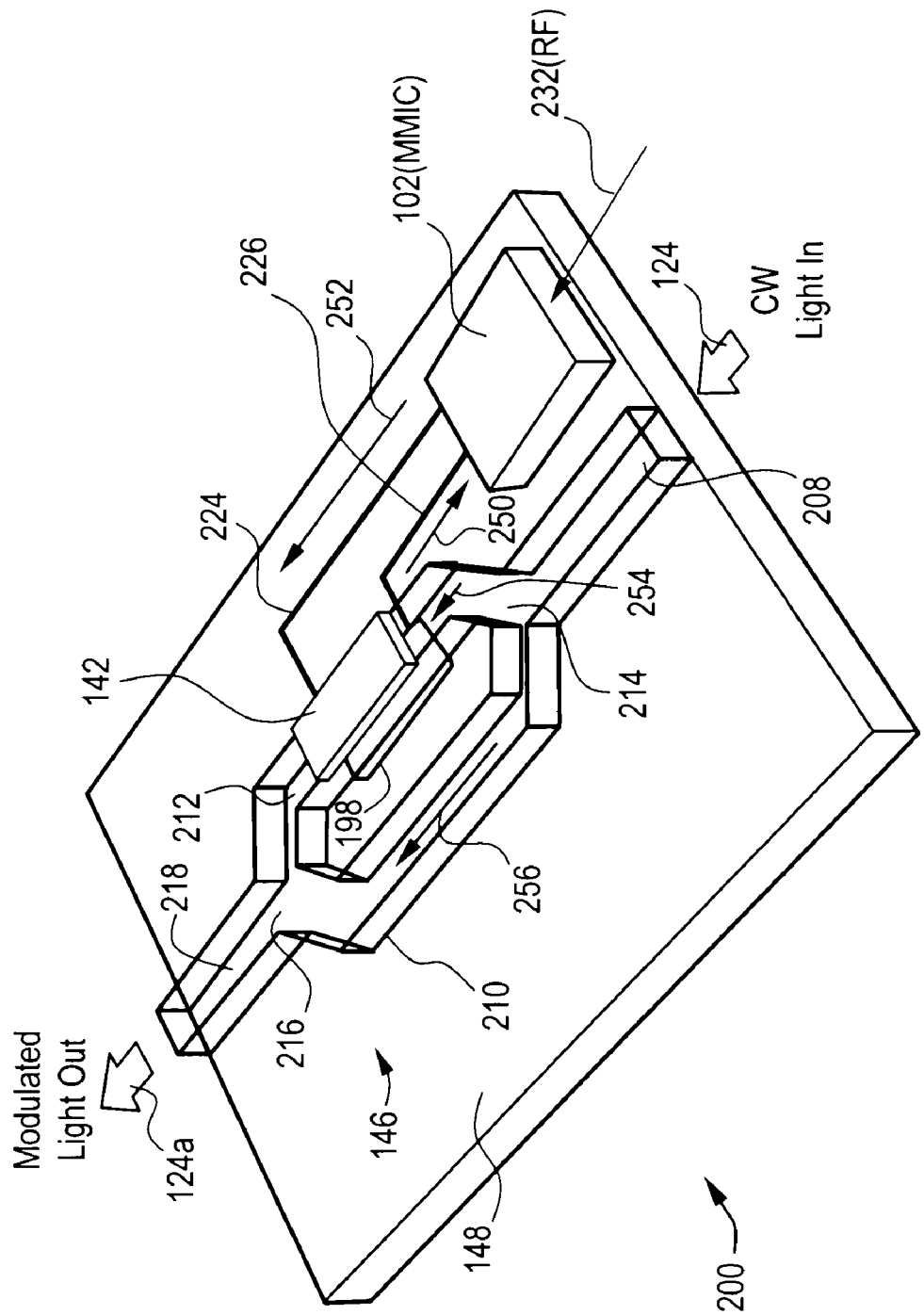
FIG. 16 is a schematic diagram of an integrated optoelectronic circuit for modulating an optical signal.

Referring to FIG. 4, the integrated micro optical bench 100 further comprises a polymer electro-optic device such as a waveguide 146, 148 positioned on or imbedded within one of the flexible dielectric substrates 132, 186 and receptive of the optical signal 124 from the optoelectronic integrated circuit 108. The polymer electro-optic waveguide 146, 148 may be for example, in the nature of a Mach-Zehnder interferometer (MZI) as is shown in greater detail in FIG. 16. Therein, a ground electrode 198 is positioned along one branch 212 of the MZI 146 and a signal electrode 142 is positioned along branch 212 opposite the ground electrode 198. The signal electrode 142 is receptive of a modulating signal 252 from the electronic driver 102 for modulating the optical signal 124 in the MZI 146. In FIG. 16, the MZI 146 comprises an input channel 208 receptive of the optical signal 124 from the OEIC 108. A beam splitter 214 splits the optical signal 124 into two beams 254, 256 and directs them separately along a first branch 210 and a second branch 212. In the embodiment of FIG. 16, electrodes 142, 198 are positioned diametrically opposed to one another across one of the branches of the MZI 146. Alternatively, a plurality of ground electrodes 198 may be separately positioned along the first branch 210 and second branch 212 with electrode 142 positioned between and along the first branch 210 and the second branch 212.

Figure 5:
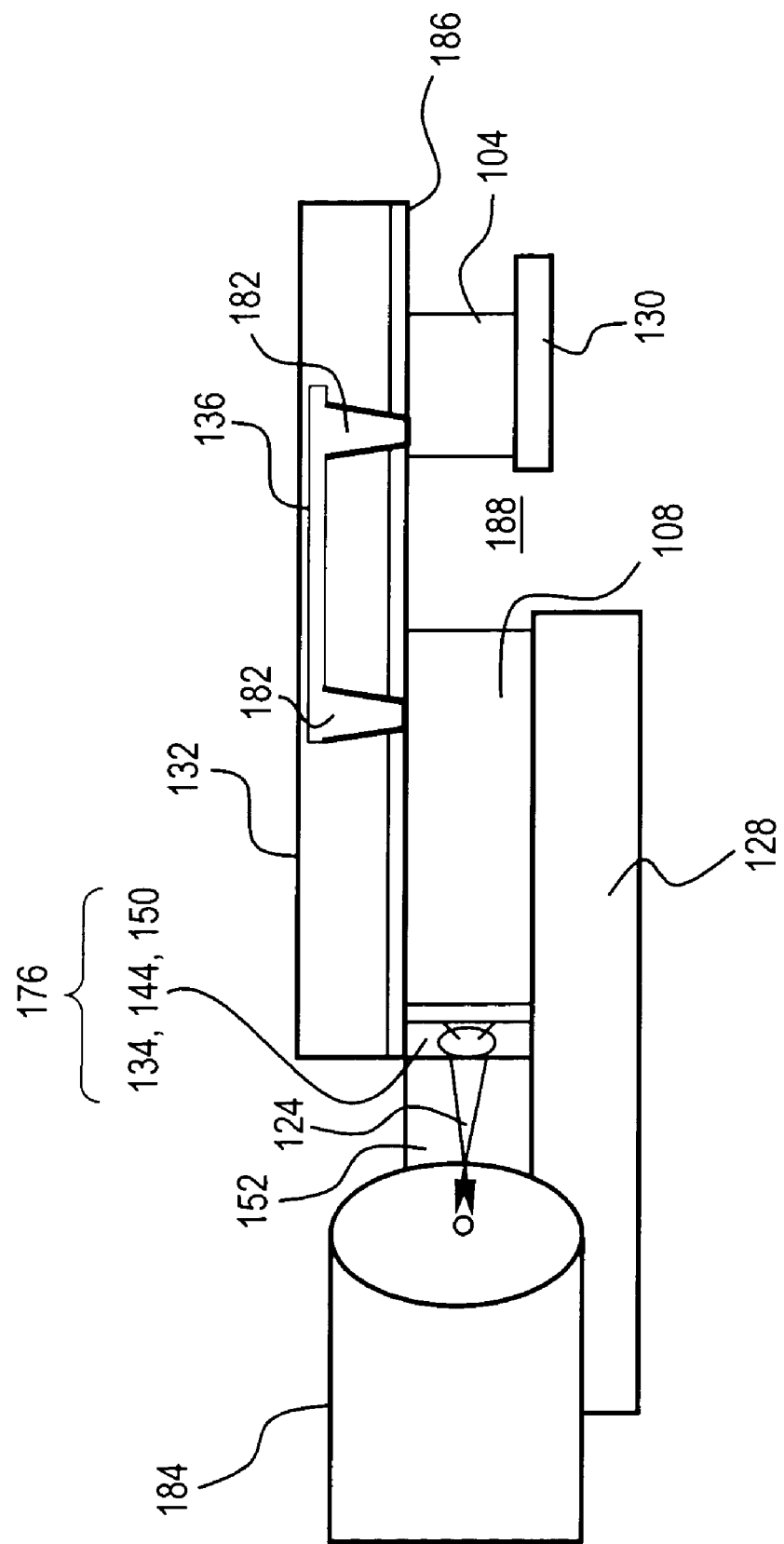
FIG. 5 is a sectional view of the integrated micro optical bench of FIG. 1.
Figure 6:
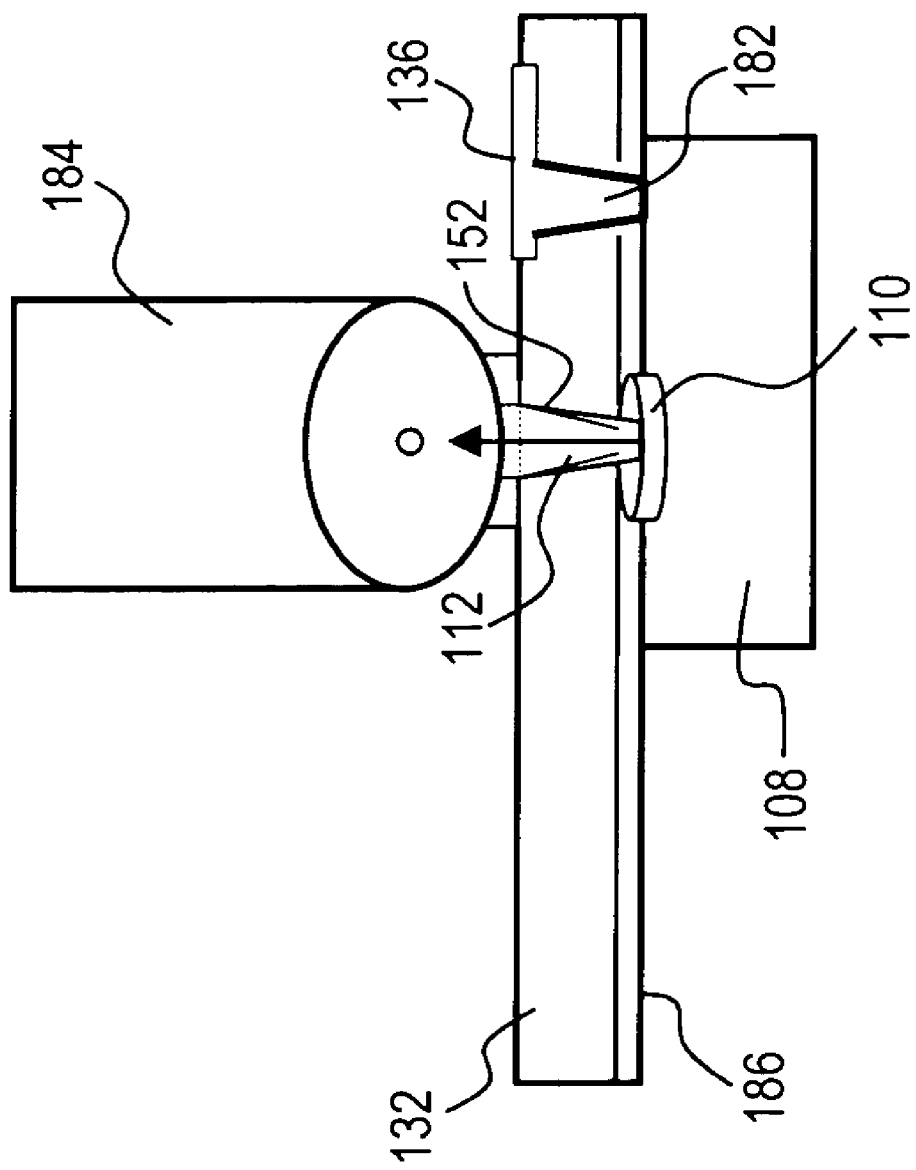
FIG. 6 is a partial sectional view of integrated micro optical bench of FIG. 1.
Figure 7:
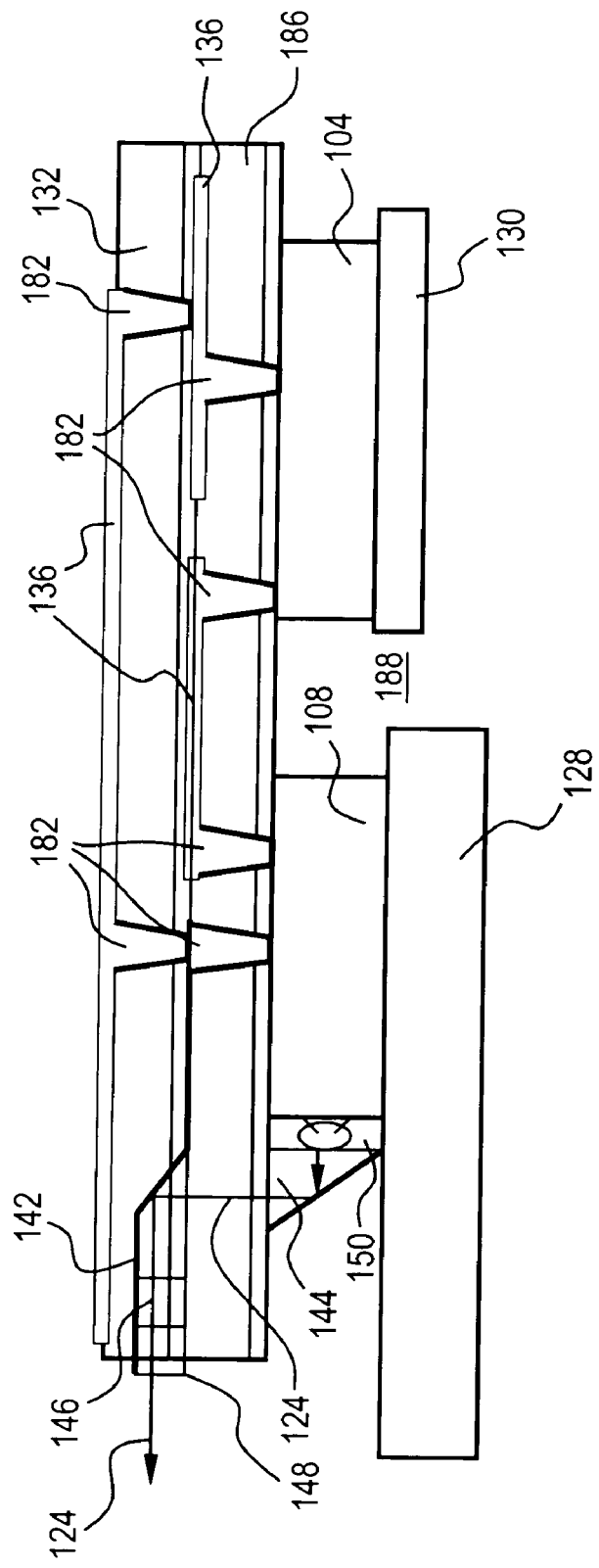
FIG. 7 is a sectional view of the integrated micro optical bench of FIG. 1.
Figure 8:
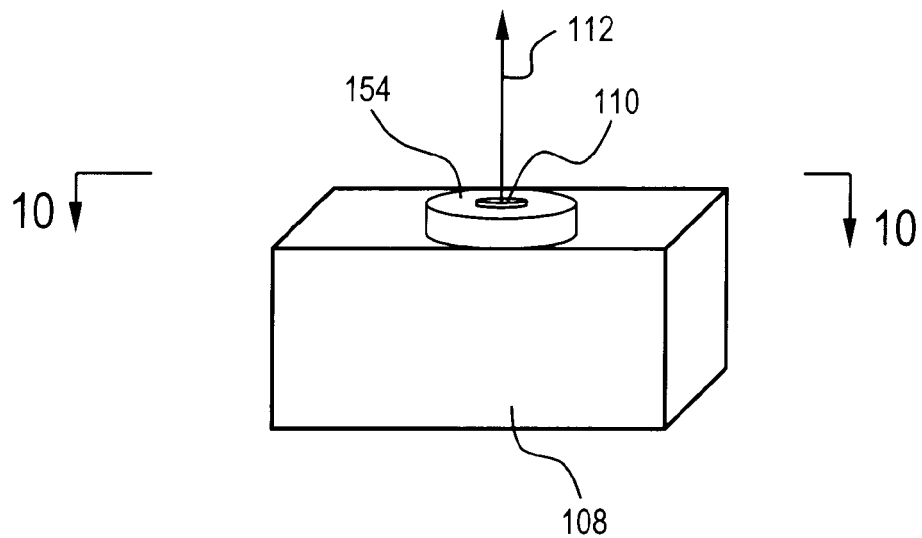
FIG. 8 is a view of a vertical cavity surface emitting laser having an annular photodetector at the exit aperture of the laser.

Referring to FIGS. 3, 4, 5 and 7, the integrated micro optical bench 100 further comprises an optical system 176 including at least one of a polarizer 134, for polarizing the output optical signal 124, a collimator 150 for collimating the output optical signal 124, and a beam reflector 144 such as a prism or a mirror. The optical system 176 is receptive of the optical signal 124 from the optoelectronic integrated circuit 108 and operative thereby to condition or shape and direct the optical signal 124 to the electro-optic waveguide 146, 148. The optical system 176 provides corrective functions such as mode conversion, providing the correct reflective angle for coupling the output optical signal 124 to the MZI 146, 148 or to the waveguide 184. As seen in FIGS. 5 and 6, the integrated micro optical bench 100 may also include an index matching polymer or glass 152 when the optical signal 124 is coupled from the OEIC 108 (or the optical system 176) to waveguide 184 such as an optical fiber 184. Alternatively, no such index matching material may be employed and instead there may be a free space optical path between the OEIC 108 (or the optical system 176) to the waveguide 184.

Figure 9:
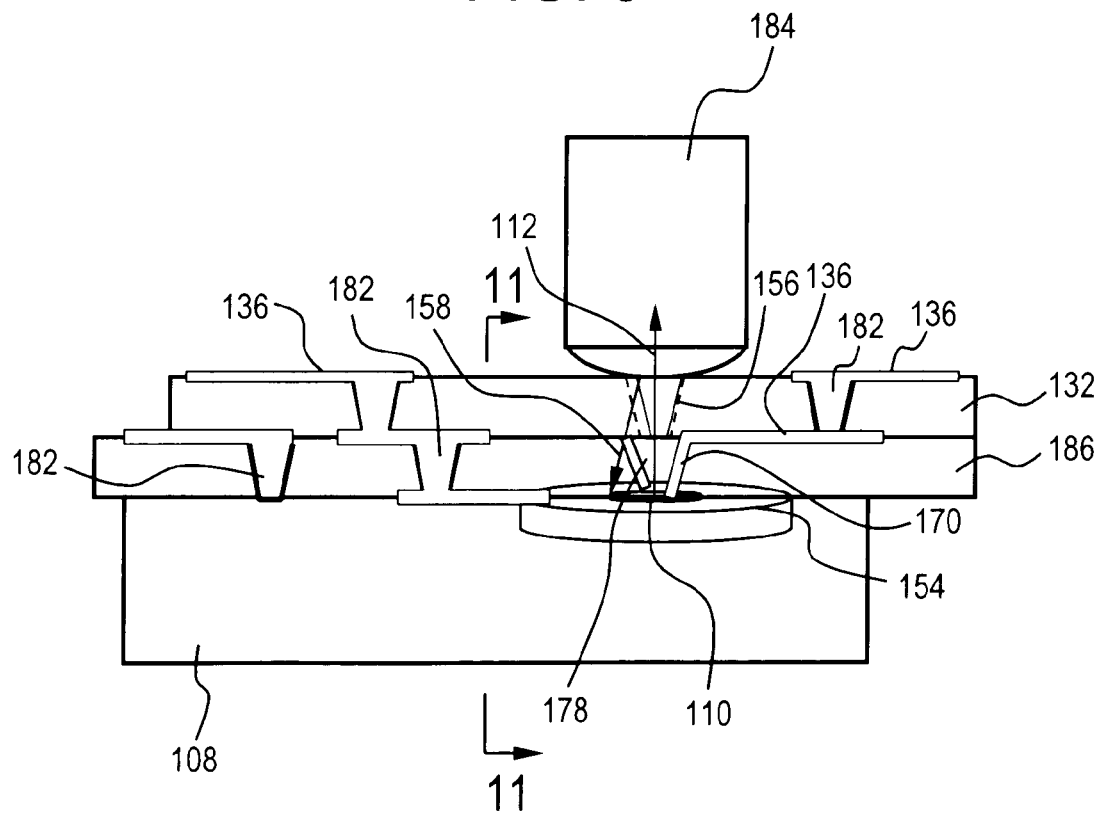
FIG. 9 is a partial view of the vertical cavity surface emitting laser with annular photodetector coupling light to a waveguide wherein the photodetector receives light from the waveguide.
Figure 10:
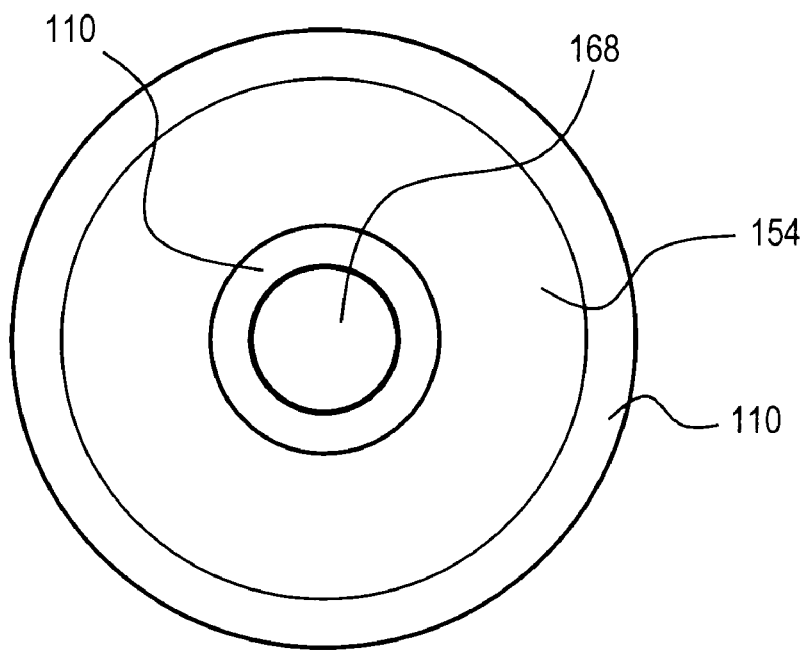
FIG. 10 is an end view of a vertical cavity surface emitting laser.
Figure 11:
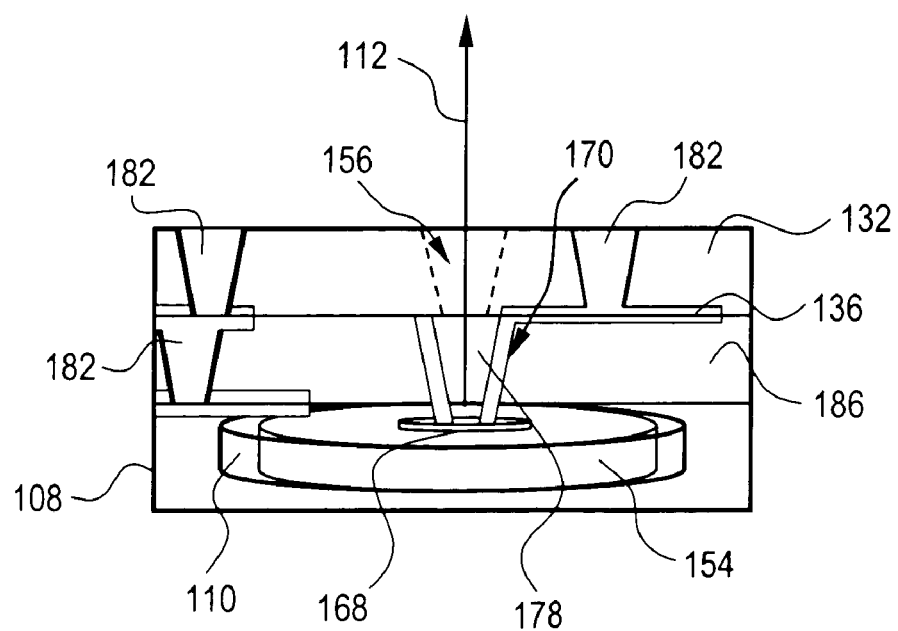
FIG. 11 is a sectional view of the vertical cavity surface emitting laser of FIG. 9.
Figure 17:
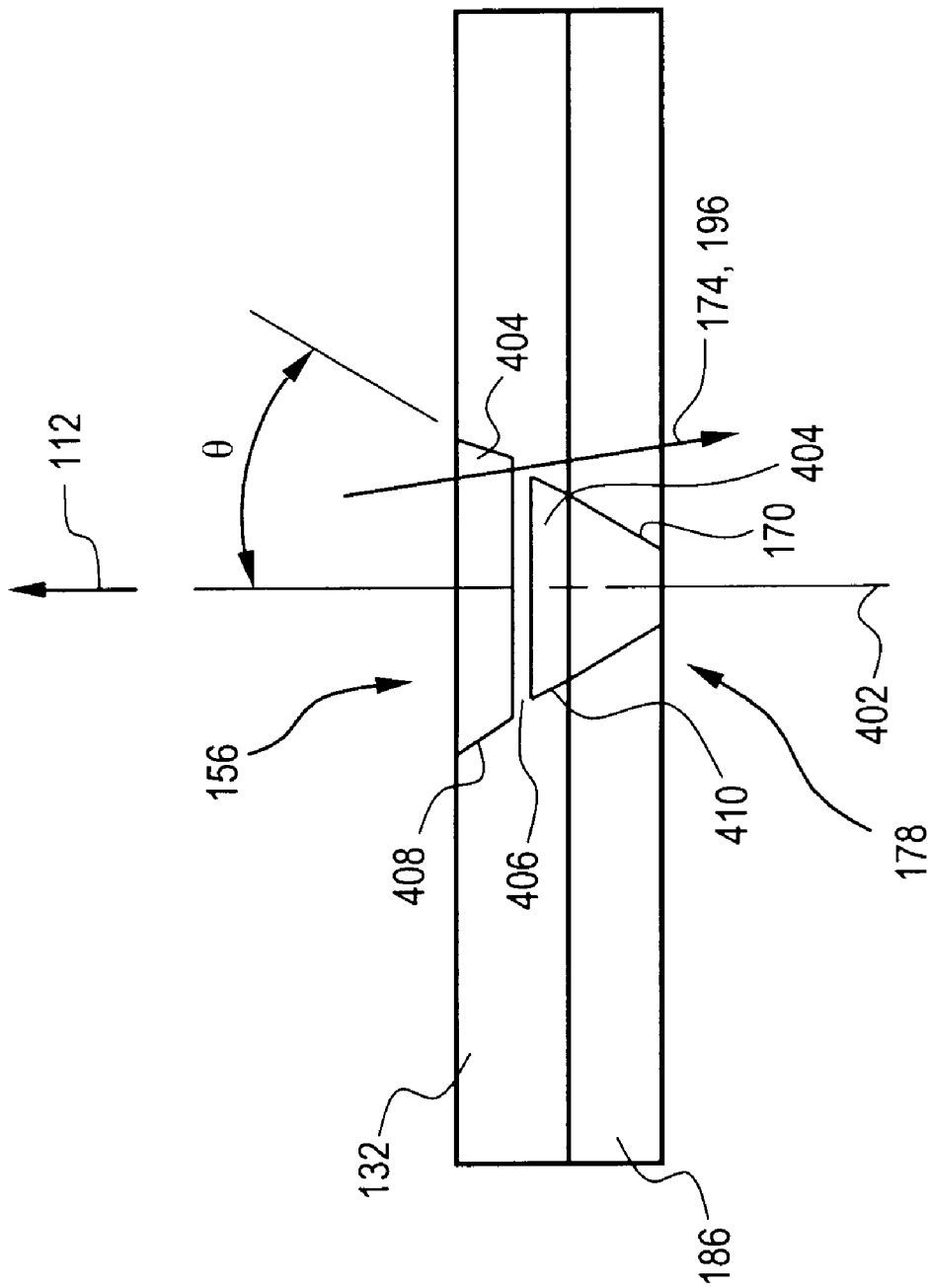
FIG. 17 is a cross sectional view of via holes in flexible dielectric substrates.
Figure 18:
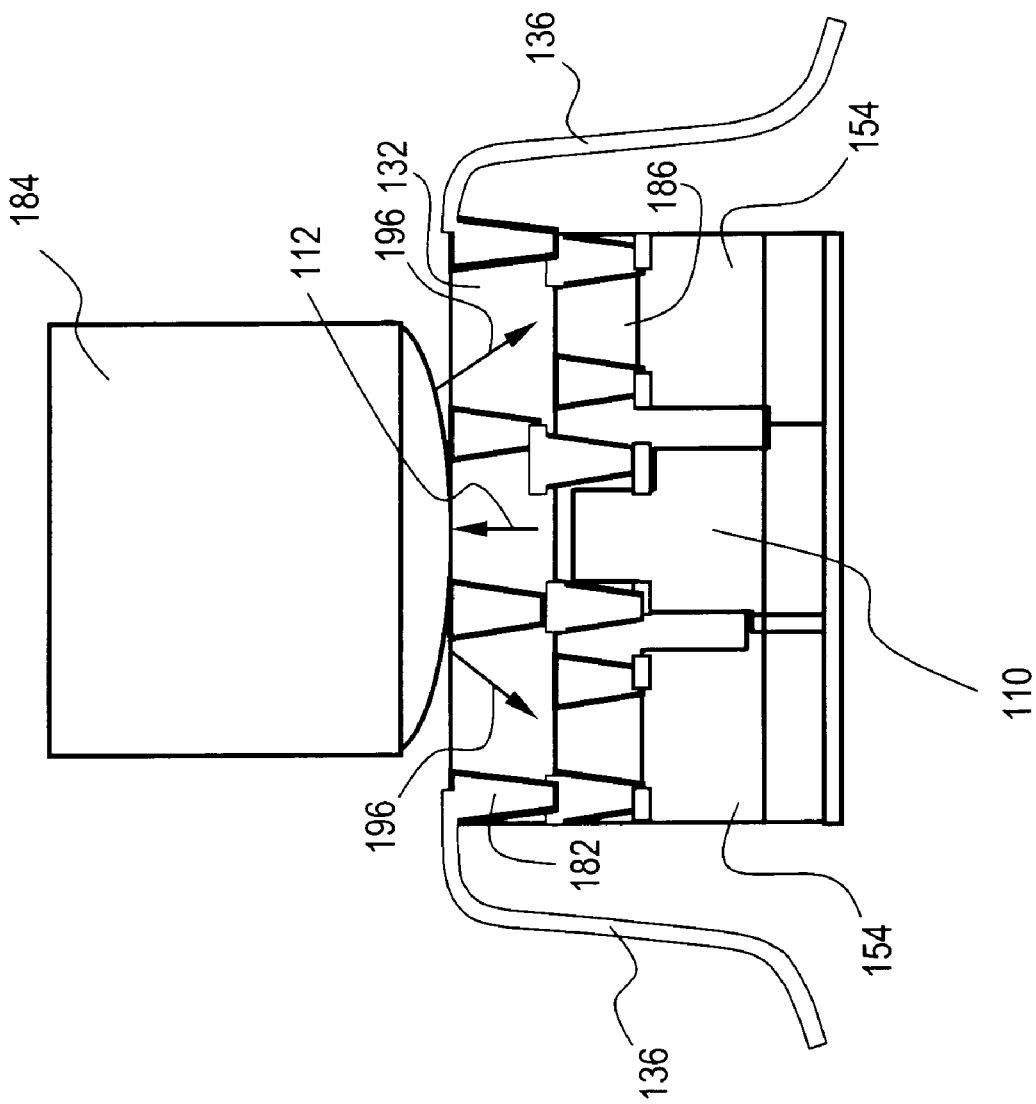
FIG. 18 is a cross sectional view of a vertical cavity surface emitting laser with a photo detector array and an abutting optical waveguide.

In FIGS. 8-14 and 18 and 19, the OEIC 108 includes a surface emitting laser, such as a vertical cavity surface emitting laser (VCSEL) 110. An annular photodetector 154 is positioned around the exit aperture 168 of the VCSEL 110. In FIG. 9, the VCSEL 110 provides as output an optical signal 112 directed to a waveguide 184 such as an optical fiber. In a test condition, for example, the photodetector 154 may receive from the waveguide 184 a reflected return test signal 158 that monitors the operation of the VCSEL 110. Alternatively signal 158 may be a signal received directly from the waveguide 184. In either case the micro optical system 100 is operative thereby to act in a bi-directional manner (e.g., to transmit and to receive). In FIG. 9, the first and second flexible dielectric substrates 132, 186 include via holes 156, 178. Via hole 178 includes metallization layer 170 connected to metallization layer 136. As seen in FIG. 17, the micro optical system includes the plurality of via holes 156, 178. The first via hole 156 is in the first flexible dielectric substrate 132 and the second via hole 178 is in the second flexible dielectric substrate 186 aligned with the first via hole 156 along an axis 402. The first and second via holes 156, 178 are in the nature of a truncated cone subtending an angle of theta measured with respect to the axis 402. Typical values of theta lie in the range of approximately 25 degrees to 35 degrees. The first via hole 156 includes a metallized band (or layer) 408 on a surface thereof. The metallized band 408 includes a plurality of metallized bands on the surface 410 of the first via hole 156. The plurality of metallized bands 408, 410 include a nonmetallized band 406 positioned between the plurality of metallized bands 408, 410, thus making an alternating set of metallized and nonmetallized bands 406, 408, 410 wherein light 112 emanating from the VCSEL 110 is prevented from leaking into the first dielectric substrate 132 while light 174, 196 emanating from a waveguide or other device may pass through the nonmetallized band 406. Metallization is the deposition of thin film patterns of conductive material onto the dielectric substrates 132, 186, or the surfaces thereof, to provide electrical interconnections of electronic components of the micro optical system. It will be understood that the metallized bands 408, 410 in the first via hole 156 do not have an electrical function.

Figure 12:
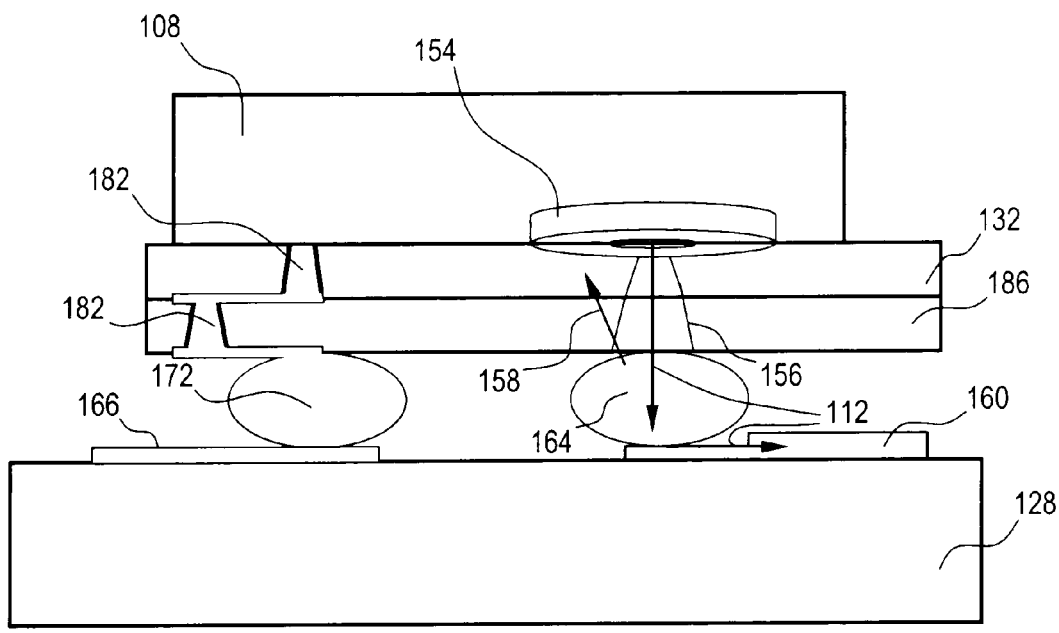
FIG. 12 is a partial view of the integrated micro optical bench of FIG. 1 including a ball grid array and optical ball grid array in flip chip configuration.
Figure 13:
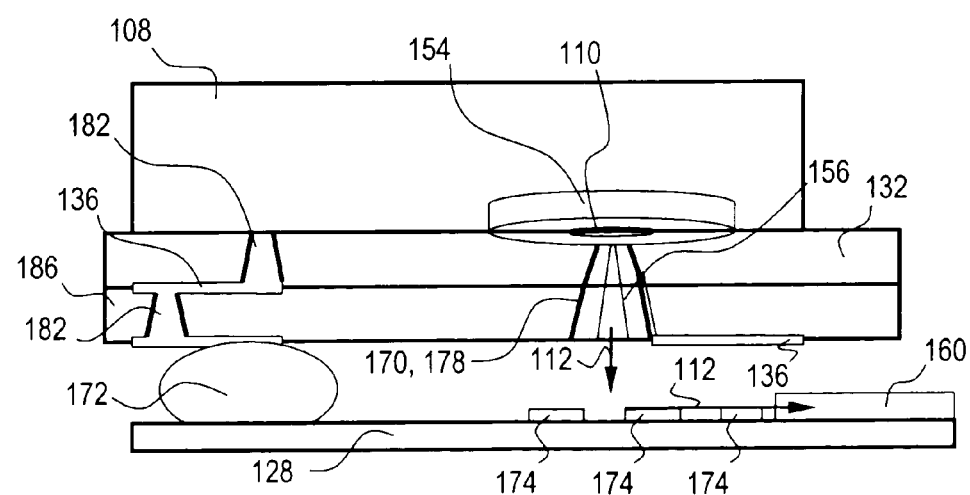
FIG. 13 is a partial view of the optical bench of FIG. 1 including a ball grid array in flip chip configuration.
Figure 19:
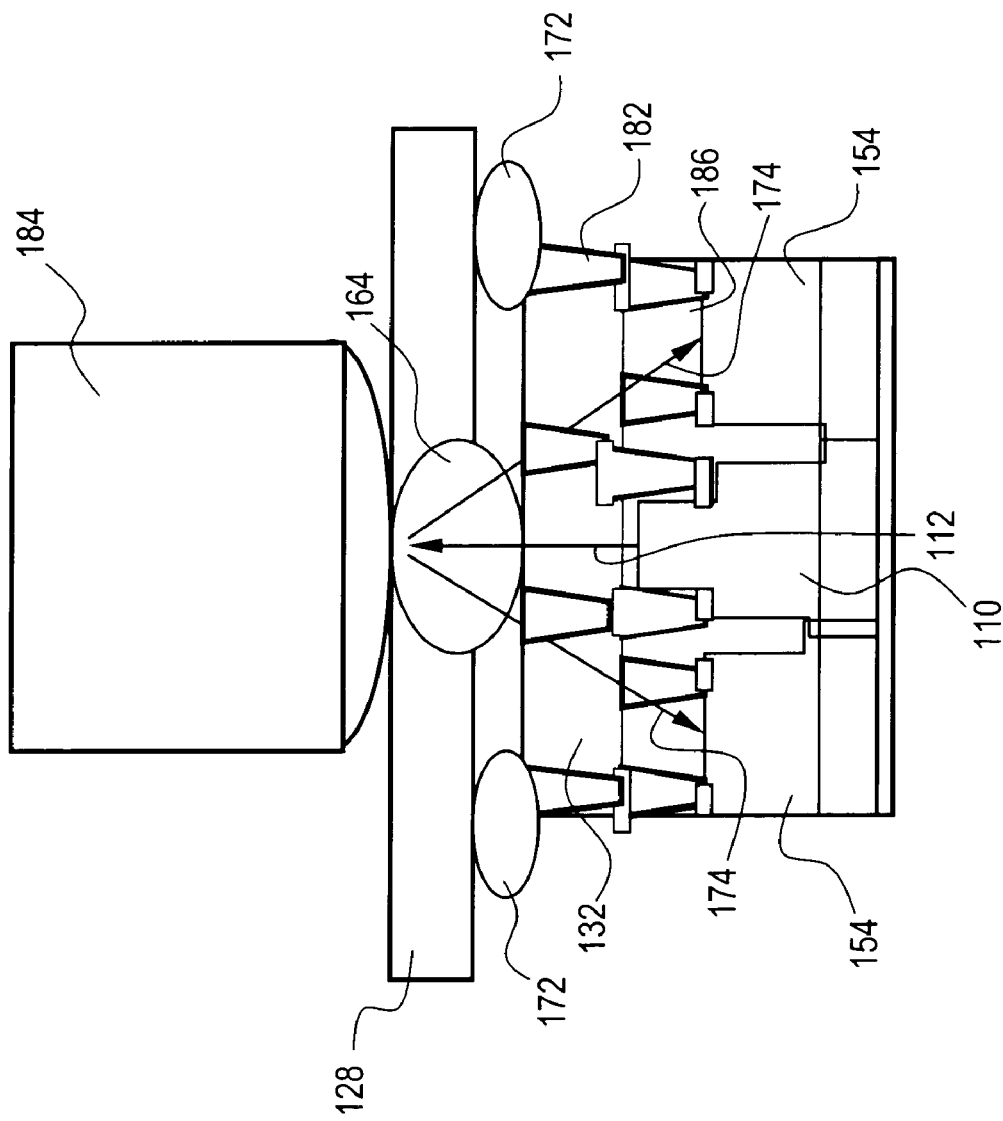
FIG. 19 is a cross sectional view of a vertical cavity surface emitting laser with a photo detector array and an abutting optical waveguide in a flip chip configuration.

In FIGS. 12, 13 and 19, the integrated micro optical bench 100 further comprises a ball grid array (BGA) 172 in a flip chip configuration for making direct electrical and mechanical connection between the rigid substrate 128 and the first and second flexible dielectric polymer substrates 132, 186. In the flip chip configuration the OEIC 108 has all of its terminations on one side in the form of bump contacts or bead type pads to permit flip or face down mounting of the OEIC 108 by contact of leads to the required circuit interconnectors.

In addition, the integrated micro optical bench 100 further comprises an optical ball grid array (OBGA) 164 for coupling optical signals such as the output optical signal 112 of the VCSEL 110, to other devices in the micro optical bench 100 or to external devices such as optical fiber 184. An Optical Ball Grid Array (OBGA) is a structure for coupling optoelectronic input/output (I/O) between optoelectronic devices using surface mount technology (SMT). In FIGS. 12, 13 and 19 an OBGA 164 comprises an encapsulated volume which may encompass for example, free space, a waveguide (e.g., a polymer or Silica on silicon) or an optical media suitable for carrying, directing or guiding an optical ray (or signal). The OBGA 164 couples, reflects, or otherwise directs the output optical signal 12 from the VCSEL 110 to other optical or electronic devices in the micro optical bench 100. The OBGA 164 may be shaped as a ball or an ellipse, with top/bottom mounts or electrical bias pins to power internal microelectromechanical structures (MEMS), such as programmable deflection surfaces (e.g., deformable mirrors under electronic control). The OBGA 164 forms an interconnection protected from contamination and/or environmental effects which is also compliant so as to allow for the proper alignment of optical and optoelectronic devices of the micro optical bench 100. The OBGA 164 structure may involve a portion of the optical rays impinging upon a reflective surface such as a flat mirror 322 (FIG. 15A) or parabolic mirror 324 (FIG. 15B), or an intentionally misaligned micromachined corner cube retroreflector (CCR) 306 (FIG. 14) with an aperture 316 therein.

The deformable CCR embodiment (FIG. 14) of the OBGA 164 employs three mutually orthogonal reflective surfaces or mirrors 310, 312, 314, forming a concave corner cube 306, to insure light 112 entering the OBGA 164 is at least partially reflected. An aperture 316 is optimized to permit a first portion of light 320 to pass therethrough, with a second proportion of light 318 reflected by intentionally deforming, or tilting, the CCR 306 by an electrostatic actuator. The first facet 310 of the CCR 306 may be at an angle of approximately 60 to 75 degrees from horizontal and the second facet 312 at an angle of approximately 45 degrees. Other angles provide reflections as required by the coupling surface exterior to the OBGA 164. The aperture 316 permits reflection to be optimally selected for a proportional energy reflector having high efficiency and high energy pass-through effect. Photons emanating from the facet, or impinging on the face, of an optoelectronic device are guided or directed by the OBGA 164 so as to enable low crosstalk and low signal attenuation along with highly accurate optical alignment.

Figure 14:
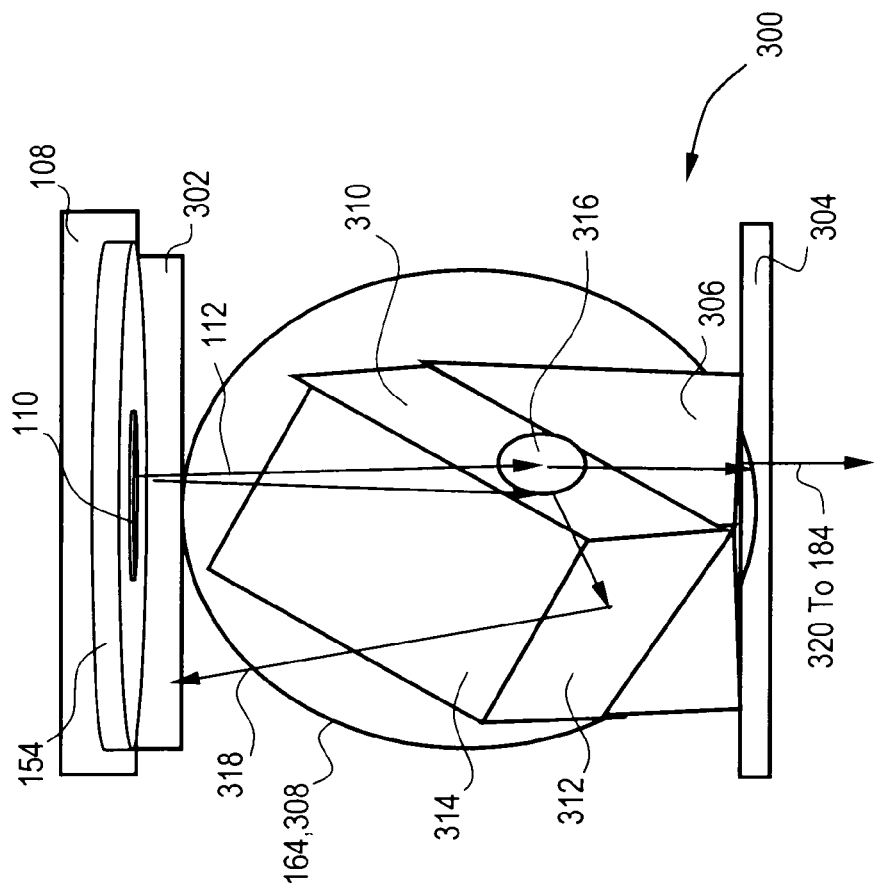
FIG. 14 is a view of an optical ball grid array as a corner cube reflector.
Figure 15A:
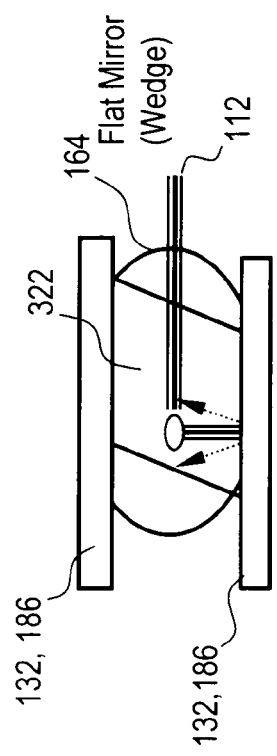
FIG. 15A is a view of an optical ball grid array as a flat mirror.
Figure 15B:
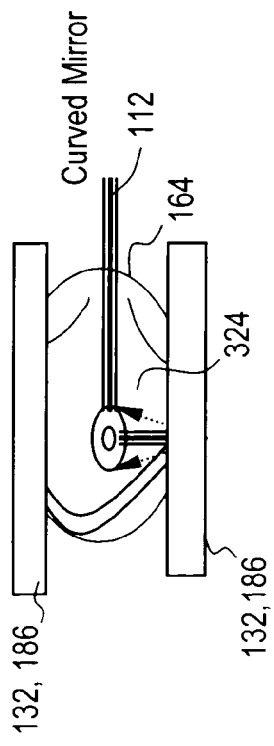
FIG. 15B is a view of an optical ball grid array as a curved mirror.

In FIG. 14 the OBGA is shown generally at 300. The OBGA 300 comprises an adjustable (e.g. tiltable) CCR 306 encompassed within an index matched gel, adhesive or epoxy 308. The CCR 306 includes a set of mutually orthogonal facets 310, 312, 314. One facet includes an aperture 316. The CCR 306 is receptive of the light 112 emanating from the VCSEL 110. A first segment of the light output 320 passes through the aperture 316 while a second segment thereof 318 is reflected by the facets 310, 312 to the photodetector 154. By tilting the CCR 306 at an angle of beta the first segment of light 320 can be passed through the aperture 316 while the remaining portion of the light signal 31 8 can be reflected to the detector 154. The intended operation of the OBGA 164 is to monitor optical signals or detect modulation in conjunction with separate or joint VCSEL/PIN devices 154, or with those devices otherwise co-joined in a single device or in close proximity.

Deformable thermoplasticity or other deformable thermal effects, or deformable mirror surfaces may comprise the CCR 306. Traditional ball grid array (BGA) may be microsized, forming chip-scale and wafer scale embodiments that merely represent the microminiturization allowed under expected further improvements in lithography. Deformability in MEMS structures, or other materials, involves the active bias or thermal activation of a material to induce an alteration in the surface profile. In this disclosure, by intentionally misaligning one or more of the CCR surfaces 310, 312, 314, one can provide a monitoring function of a proportion of the optical output signal 112 without the need to monitor 100% of the available signal strength. Static (set once) and dynamic adjustment of the OBGA 164 allows for optical tuning over the lifecycle stresses induced by the environment or by aging of the micro optical bench 100.

Thus, based upon the foregoing description, a novel micro optical bench has been disclosed. Components thereof include an optical communications transceiver function including laser diode based transmitter and photodiode receiver placed upon a novel platform optimized for high coupling ratio and low loss by aligning the mechanical optical axis and mode coupling with minimal material dispersion. Modal noise is suppressed by matching the mode field diameter and mode distribution coupling in the applied media. Matching the electromagnetic waves reaching devices from optical or electrical connection is provided by a managed and colocated dielectric and propagation media (optical core or conductor) to reduce mode selective loss effects. Proximity parameters impacting loss budget from devices and structures such as numerical aperture are also addressed by capturing the angular spread of light within the adjacent connection before it exceeds the core or detector aperture. Thermal isolation between high electrical driver heat energy and stable optoelectronics is provided by a miniaturized boundary between two physically adjacent substrates that have separate thermal paths enabled by conduction, such as micropipes that change the direction of these opposite thermal fronts. High quality electrical path matching is by overlay of controlled impedance paths. Low connector degradation is provided by coplanar direct metallization and minimized optical return loss by a polymer, air or other dielectric system encapsulating, radiating, illuminating or bridging these such interconnections with devices. Light emission from devices or structures that is orthogonal, perpendicular or at an odd angle to the device or coupling surface is coupled at minimal or zero dimension and loss by such interconnection.

Any reference to first, second, etc., or front or back, right or left, top or bottom, upper or lower, horizontal or vertical, or any other phrase indicating the relative position of one object, quantity or variable with respect to another is, unless noted otherwise, intended for the convenience of description, and does not limit the present invention or its components to any one positional, spatial or temporal orientation. All dimensions of the components in the attached Figures can vary with a potential design and the intended use of an embodiment without departing from the scope of the invention.

While the invention has been described with reference to several embodiments thereof, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed as the best mode contemplated for carrying out this invention, but that the invention will include all embodiments falling within the scope of the appended claims.

The invention claimed is:

1. A micro optical system comprising:
    a rigid substrate;
    a thermal substrate positioned in a spaced relation from the rigid substrate;
    an optoelectronic integrated circuit positioned on the rigid substrate;
    an electronic driver positioned on the thermal substrate for driving the optoelectronic integrated circuit; and
    a flexible dielectric substrate positioned so as to overlay and imbed therein the electronic driver, the optoelectronic integrated circuit, the thermal substrate and the rigid substrate, wherein the optoelectronic integrated circuit comprises a laser for generating an optical output signal;
    the flexible dielectric substrate coupling the rigid substrate and the thermal substrate to provide flexure between the rigid substrate and the thermal substrate.

2. The micro optical system as set forth in claim 1 further comprising an electroabsorptive modulator for modulating the optical output signal.

3. The micro optical system as set forth in claim 1 wherein the electronic driver comprises a microwave monolithic integrated circuit.

4. The micro optical system as set forth in claim 1 further comprising:
    an electro-optic device positioned on or embedded within the flexible dielectric substrate and receptive of the optical output signal from the optoelectronic integrated circuit;
    a ground electrode positioned along the electro-optic waveguide;
    a signal electrode positioned along the electro-optic waveguide opposite the ground electrode and receptive of a modulating signal from the electronic driver for modulating the optical output signal in the electro-optic waveguide.

5. The micro optical system as set forth in claim 1 further comprising:
    an optical system including a polarizer, a collimator or a beam reflector, wherein the optical system is receptive of the optical output signal from the optoelectronic integrated circuit and operative thereby to direct the optical output signal to the electro-optic waveguide.

6. The micro optical system as set forth in claim 1 further comprising a thermistor positioned on the rigid substrate for monitoring the temperature of the optical substrate.

7. The micro optical system as set forth in claim 1 wherein the flexible dielectric substrate comprises a polyamide polymer.

8. The micro optical system as set forth in claim 1 wherein the flexible dielectric substrate includes a plurality of via holes.

9. The micro optical system as set forth in claim 8 further comprising a plurality of patterned metallization layers positioned on the flexible dielectric substrate and electrically interconnecting the electronic driver and the optoelectronic integrated circuit through the plurality of via holes.

10. The micro optical system as set forth in claim 1 further comprising a power monitoring unit receptive of a part of the optical output signal for monitoring the optical output signal.

11. The micro optical system as set forth in claim 10 further comprising a control unit positioned on the thermal substrate and in signal communication with the power monitoring unit for controlling the driver.

12. The micro optical system as set forth in claim 1 further comprising an optical ball grid array positioned between the flexible dielectric substrate and the rigid substrate.

13. The micro optical system as set forth in claim 12 wherein the optical ball grid array comprises:
    an index matching material receptive of the optical output signal;
    a waveguide encapsulated within the index matching material for guiding the optical output signal.

14. The micro optical system as set forth in claim 12 wherein the optical ball grid array comprises:
    an index matching material receptive of the optical output signal;
    a diffractive optical element encapsulated within the index matching material for diffracting the optical output signal.

15. The micro optical system as set forth in claim 12 wherein the optical ball grid array comprises:
    an index matching material receptive of the optical output signal;
    a reflecting surface encapsulated within the index matching material for redirecting the optical output signal.

16. The micro optical system as set forth in claim 15 wherein the reflecting surface comprises a flat mirror.

17. The micro optical system as set forth in claim 15 wherein the reflecting surface comprises a curved mirror.

18. The micro optical system as set forth in claim 15 wherein the reflecting surface comprises a corner cube reflector.

19. The micro optical system as set forth in claim 18 wherein the corner cube reflector comprises:
   a plurality of mutually perpendicular reflecting surfaces; and
   an aperture positioned in one of the plurality of mutually perpendicular reflecting surfaces and receptive the optical output signal;
   wherein a first segment of the optical output signal is reflected therefrom and a second segment of the optical output signal continues therethrough.

20. The micro optical system as set forth in claim 1 wherein the flexible dielectric substrate includes a plurality of flexible dielectric substrates.

21. The micro optical system as set forth in claim 20 comprising a plurality of via holes having:
   a first via hole in a first flexible dielectric substrate; and
   a second via hole in a second flexible dielectric substrate and aligned with the first via hole along an axis.

22. The micro optical system as set forth in claim 20 wherein the first via hole includes a metallized band on a surface of the first via hole.

23. The micro optical system as set forth in claim 22 wherein the metallized band includes a plurality of metallized bands on the surface of the first via hole.

24. The micro optical system as set forth in claim 23 wherein the plurality of metallized bands include a nonmetallized band positioned between the plurality of metallized bands.

25. A micro optical system comprising:
   a rigid substrate;
   a thermal substrate positioned in a spaced relation from the rigid substrate;
   an optoelectronic integrated circuit positioned on the rigid substrate;
   an electronic driver positioned on the thermal substrate for driving the optoelectronic integrated circuit; and
   a flexible dielectric substrate positioned so as to overlay and imbed therein the electronic driver, the optoelectronic integrated circuit, the thermal substrate and the rigid substrate, wherein the flexible dielectric substrate comprises a poly(acrylate), a poly(alkyl methacrylate), a poly(tetrafluoroethylene), a silicone or mixtures thereof wherein the alkyl groups have one to about twelve carbon atoms;
   the flexible dielectric substrate coupling the rigid substrate and the thermal substrate to provide flexure between the rigid substrate and the thermal substrate.

26. The micro optical system as set forth in claim 25 wherein the poly(alkyl methacrylate) comprises poly(methyl methacrylate).

27. A micro optical system comprising:
   a rigid substrate;
   a thermal substrate positioned in a spaced relation from the rigid substrate;
   an optoelectronic integrated circuit positioned on the rigid substrate;
   an electronic driver positioned on the thermal substrate for driving the optoelectronic integrated circuit; and
   a flexible dielectric substrate positioned so as to overlay and imbed therein the electronic driver, the optoelectronic integrated circuit, the thermal substrate and the rigid substrate, wherein the flexible dielectric substrate includes a plurality of flexible dielectric substrates and comprises a plurality of via holes comprising a first via hole in a first flexible dielectric substrate; and a second via hole in a second flexible dielectric substrate and aligned with the first via hole along an axis, wherein the first and second via holes are in the nature of a truncated cone subtending an angle of theta measured with respect to the axis;
   the flexible dielectric substrate coupling the rigid substrate and the thermal substrate to provide flexure between the rigid substrate and the thermal substrate.

28. The micro optical system as set forth in claim 27 wherein the angle theta is in the range of approximately 25 to 35 degrees.

* * * * *